(12) United States Patent
Liepold et al.

(10) Patent No.: US 8,115,223 B2
(45) Date of Patent: Feb. 14, 2012

(54) RADIATION EMITTING DEVICE

(75) Inventors: Ute Liepold, Munich (DE); Manfred Kobusch, Munich (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 185 days.

(21) Appl. No.: 12/443,288

(22) PCT Filed: Aug. 22, 2007

(86) PCT No.: PCT/DE2007/001485
§ 371 (c)(1),
(2), (4) Date: May 5, 2009

(87) PCT Pub. No.: WO2008/040270
PCT Pub. Date: Apr. 10, 2008

(65) Prior Publication Data
US 2010/0006879 A1  Jan. 14, 2010

(30) Foreign Application Priority Data

Sep. 27, 2006  (DE) .................. 10 2006 045 705
May 3, 2007  (DE) .................. 10 2007 020 782

(51) Int. Cl.
*H01L 33/00* (2010.01)
*H01L 21/00* (2010.01)

(52) U.S. Cl. ............... 257/98; 438/29; 257/E33.061

(58) Field of Classification Search ........... 257/98, 257/E33.061
See application file for complete search history.

(56) References Cited

U.S. PATENT DOCUMENTS

| | | | |
|---|---|---|---|
| 6,066,861 | A | 5/2000 | Hoehn et al. |
| 6,294,800 | B1 | 9/2001 | Duggal et al. |
| 6,504,179 | B1 | 1/2003 | Ellens et al. |
| 6,616,862 | B2 | 9/2003 | Srivastava et al. |
| 6,670,748 | B2 | 12/2003 | Ellens et al. |
| 6,809,347 | B2 | 10/2004 | Tasch et al. |
| 7,064,480 | B2 | 6/2006 | Bokor et al. |
| 2001/0000436 | A1* | 4/2001 | Nose et al. ............... 349/65 |
| 2003/0146690 | A1 | 8/2003 | Ellens et al. |
| 2004/0056256 | A1 | 3/2004 | Bokor et al. |
| 2004/0062699 | A1 | 4/2004 | Oshio |
| 2005/0218780 | A1 | 10/2005 | Chen |
| 2007/0035813 | A1 | 2/2007 | Roth et al. |
| 2008/0128679 | A1* | 6/2008 | Tian et al. ............... 257/14 |

FOREIGN PATENT DOCUMENTS

DE  196 38 667 A1  4/1998
(Continued)

OTHER PUBLICATIONS

Zhang, X., et al., "Luminescence Properties and Energy Transfer of $Eu^{2+}$ Doped $Ca_8Mg(SiO_4)_4Cl_2$ Phosphors," Journal of the Electrochemical Society, Feb. 1992, pp. 622-625, vol. 139, No. 2.

(Continued)

*Primary Examiner* — Lex Malsawma
(74) *Attorney, Agent, or Firm* — Slater & Matsil, L.L.P.

(57) ABSTRACT

A radiation emitting device includes a radiation emitting functional layer that emits a primary radiation, and a radiation conversion material that is arranged in the radiation path of the radiation emitting functional layer and converts the primary radiation at least partially into a radiation of greater wavelength.

29 Claims, 2 Drawing Sheets

FOREIGN PATENT DOCUMENTS

| | | |
|---|---|---|
| DE | 100 36 940 A1 | 2/2002 |
| DE | 101 47 040 A1 | 4/2003 |
| DE | 102 59 946 A1 | 7/2004 |
| DE | 103 19 091 A1 | 9/2004 |
| DE | 10 2005 051 063 A1 | 6/2006 |
| WO | WO 98/12757 | 3/1998 |
| WO | WO 00/33390 | 6/2000 |
| WO | WO 01/93342 A1 | 12/2001 |
| WO | WO 02/054502 A1 | 7/2002 |

OTHER PUBLICATIONS

Dorenbos, P., "Energy of the first $4f^7 \rightarrow 4f^6 5d$ transition of $Eu^{2+}$ in inorganic compounds," Journal of Luminescence, 2003, 22 pages, Elsevier Science, B.V.

Ding, W., et al., "A novel orange phosphor of $Eu^{2+}$-activated calcium chlorosilicate for white light-emitting diodes," Journal of Solid State Chemistry, 2006, pp. 3582-3585, Elsevier Inc.

* cited by examiner

RADIATION EMITTING DEVICE

This patent application claims priority of German patent applications 10 2006 045 705.6 filed Sep. 27, 2006 and 10 2007 020 782.6 filed May 3, 2007, the disclosed contents of which are herewith incorporated by reference.

TECHNICAL FIELD

The invention relates to a radiation emitting device that emits a primary radiation and contains a radiation conversion material.

BACKGROUND

Radiation emitting devices contain two contacts, such as electrodes, which contact light-emitting functional layers in an electrically conducting manner. Electrons from the cathode and positive charges from the anode (known as holes) are injected into the emission layer. Light is generated owing to the recombination of these charges in the emission layer. The light emitted has different wavelengths depending on the semiconducting material that is used for the emission layer. To produce visible, or alternatively, colored light, the primary radiation of the semiconductor layer can be at least partially transformed into a secondary radiation. This often occurs by means of so-called conversion luminescent materials, which are excited by the primary radiation and which emit a secondary radiation at a different wavelength. There are organic and inorganic luminescent conversion materials, wherein the inorganic luminescent conversion materials have higher temperature and radiation stability. However, there are only a limited number of suitable inorganic luminescent conversion materials that fulfill the requirements concerning the excitation range and the emission range.

SUMMARY

In one aspect the invention provides new luminescent conversion materials in radiation emitting devices.

In a radiation emitting device according to an exemplary embodiment of the invention, new radiation conversion luminescent materials having the general formula $Ca_{3-x-y}Eu_xMe_ySiO_4Cl_2$ are used, that transform the primary radiation at least partially into a secondary radiation. Such a radiation emitting device comprises a radiation emitting functional layer, which emits a primary radiation, and a radiation conversion material that is arranged in the radiation path of the radiation emitting functional layer and comprises a radiation conversion luminescent material having the general formula $Ca_{3-x-y}Eu_xMe_ySiO_4Cl_2$. This radiation conversion luminescent material converts at least some of the primary radiation of the radiation emitting functional layer into a secondary radiation.

The radiation conversion luminescent material used is characterized by simple manufacture. It has good absorption in the UV and blue spectral ranges and is therefore particularly suitable for use in radiation emitting devices. In a preferred embodiment the radiation conversion luminescent material is a luminescence conversion material.

The radiation emitting device is preferably a device whose radiation emitting functional layer emits a primary radiation in the UV range, preferably at wavelengths between 360 and 400 nm. It can also be a device whose functional radiation emitting layer emits in the blue range, preferably at wavelengths between 400 and 470 nm. Materials for such radiation emitting functional layers can be organic (OLED) or inorganic. The material of the radiation emitting functional layers advantageously comprises semiconductors. Inorganic semiconductor materials are advantageously selected from a group that includes InGaN, Ga(In,Al)N and GaN. Since the radiation emitted by these radiation emitting functional layers is limited to a given wavelength range, this range is to be expanded through the use of the conversion luminescent materials.

The radiation conversion luminescent material that is used in the radiation emitting devices can be excited in the UV and blue wavelength ranges of the radiation emitted by the device.

According to a development of the invention, the radiation conversion luminescent material has an emission maximum at wavelengths between 470 nm and 550 nm, with a half width of the emission band of approximately 60 nm. In another embodiment, the radiation conversion luminescent material has an emission maximum at $512\pm3$ nm. Thus, the primary radiation is converted to a longer wavelength secondary radiation that is visible. Depending on how great a proportion of primary radiation was converted, mixtures of primary and secondary radiation are possible, which together determine the color and the chromaticity of the radiation of the radiation emitting device. This has the advantage that various colors can be produced by varying the amount of radiation conversion luminescent material in a controlled manner by controlled mixing of the primary and secondary radiation.

The radiation conversion luminescent material can be advantageously excited at wavelengths from 360 to 470 nm. This allows the conversion luminescent material to convert blue light into a different colored light, or ultraviolet radiation into visible light.

Furthermore, the radiation emitting device can contain a radiation conversion luminescent material that has the general formula $Ca_{3-x-y}Eu_xMe_ySiO_4Cl_2$, where the parameter x is selected from the range 0.05 to 0.5. The Ca may also be partially substituted by other metals Me, which are selected from a group that contains the metals Sr, Ba and Mg. The range for the parameter y is then advantageously selected between 0 and 0.5. The advantage of such a partial substitution is that the emission maximum of the radiation conversion luminescent material can be shifted to other wavelengths.

The radiation emitting device can further contain a radiation conversion luminescent material with the formula $Ca_{2.9}Eu_{0.1}SiO_4Cl_2$. This radiation conversion luminescent material has an emission maximum at 512 nm. Another embodiment of the radiation emitting device may contain a radiation conversion luminescent material with the formula $Ca_{2.625}Eu_{0.055}MgO_{0.32}SiO_4Cl_2$. This radiation conversion luminescent material has an emission maximum shifted by 3 nm into the shortwave compared to the previously mentioned radiation conversion luminescent material. The advantage of the radiation conversion luminescent materials according to the invention compared with the conventional radiation conversion luminescent material $(Ca,Eu)_8Mg(SiO_4)_4Cl_2$ is easier conversion of the starting materials during the synthesis of the radiation conversion luminescent material according to the invention, and thus a more reliable synthesis process.

In a further embodiment, the radiation conversion material covers the radiation emitting functional layer on one or more sides. The radiation conversion material can be formed as a radiation conversion body, which comprises a matrix material that is transparent to the radiation, for example, a resin such as epoxy, silicone or glasses, in which the radiation conversion luminescent material is embedded. By introducing the radiation conversion luminescent material into a matrix, the layer thickness and the degree of filling of the radiation conversion body can be varied. This allows the concentration of the radiation conversion luminescent material in the matrix material to be varied. The mixing ratio of primary and secondary radiation can thus also be controlled by the concentration of radiation conversion luminescent material in the matrix. Furthermore, the radiation conversion body can be realized by sealing the radiation emitting device.

The advantage of a radiation conversion body surrounding the radiation emitting functional layer on multiple sides is that a large incident area for the primary radiation on the radiation conversion luminescent material is achieved, and thus an increase in the conversion rate.

Furthermore, the radiation emitting device can contain a radiation conversion luminescent material that, for example, is present in a matrix in a sufficiently high concentration to completely convert the primary radiation into secondary radiation. The entire primary radiation is thus converted into longer wavelength light, the secondary radiation. The radiation emitting device can also contain a radiation conversion luminescent material that only partly converts the primary radiation into secondary radiation. This results in a mixture of primary and secondary radiation. The advantage of this is that mixed colors can be produced.

The radiation emitting device may furthermore contain a radiation conversion material that includes additional luminescent materials. The advantage of this is that other color mixes or even white light can be produced.

Examples of such luminescent materials suitable as converters that may be contained in luminescent compounds are:
  chlorosilicates, as disclosed for example in DE 10036940, U.S. equivalent U.S. Pat. No. 7,064,480, and the prior art described therein,
  ortho-silicates, sulfides, thiogallates and vanadates such as disclosed for example in WO 2000/33390 and the prior art described therein,
  aluminates, oxides, halophosphates, such as disclosed for example in U.S. Pat. No. 6,616,862 and the prior art described therein,
  nitrides, Sions and Sialons as disclosed for example in DE 10147040, U.S. equivalent U.S. Pat. No. 6,670,748, and the prior art described therein, and
  rare earth garnets, such as YAG:Ce and alkaline-earth elements as disclosed, for example, in US 2004/0062699, and the prior art described therein.

One embodiment of the invention also relates to a method of producing a radiation emitting device according to the above-described embodiments. The steps of the process comprise A) the provision of a radiation emitting functional layer and B) the arrangement of the radiation conversion material in the radiation path of the radiation emitting functional layer.

A radiation conversion body containing the radiation conversion material with the radiation conversion luminescent material can be produced on the radiation emitting functional layer in procedure step B). The radiation conversion body can enclose the radiation emitting functional layer on one or more sides. The advantage of this is that the radiation emitting device, and particularly the light-emitting surface thereof, is covered as extensively as possible by the radiation conversion body containing the radiation conversion luminescent material. The radiation conversion body can form a sealing for the radiation emitting device, for example.

Furthermore, additional luminescent materials can be introduced into the radiation conversion material. A matrix can also be used in the manufacture of the radiation conversion body, in which the radiation conversion material with the radiation conversion luminescent material is embedded. If the radiation conversion body is formed as a layer, it can have a thickness from 5 microns to several centimeters. If the radiation conversion material without a matrix is formed as a layer over the radiation emitting functional layer, the thickness of this layer can be 50 nm to 20 microns.

In a further embodiment, the radiation conversion luminescent material can be manufactured in process step B) by homogeneous mixing of calcium carbonate, calcium chloride, europium oxide, silica, and, where appropriate, an additional component selected from strontium carbonate, barium carbonate and magnesium oxide, in a stoichiometric ratio corresponding to the composition of $Ca_{3-x-y}Eu_xMe_ySiO_4Cl_2$ with $0.05 \leq x \leq 0.5$, $0 \leq y \leq 0.5$, Me=Sr and/or Ba and/or Mg. This homogeneous mixture is then annealed in a forming gas stream at 600° C. to 1000° C.

In a further embodiment, the radiation conversion body can be manufactured by dispersing the radiation conversion luminescent material into a matrix, such as epoxy, glasses or silicone. The ratio of primary to secondary radiation can be varied by means of the amount of conversion luminescent material in relation to the matrix, i.e. the degree of filling. By using a suitable matrix material, a radiation conversion body can be produced which adheres rigidly onto a carrier surface, for example on the surface of the radiation emitting functional layer. When creating a paste from the radiation conversion luminescent material, it can, in an advantageous embodiment, be changed to an arbitrary form that is favorable for conversion and then cured. The paste can be applied to the radiation emitting functional layer using various techniques.

BRIEF DESCRIPTION OF THE DRAWINGS

The invention is explained in more detail using the figures and exemplary embodiments.

DETAILED DESCRIPTION

Figure 1:
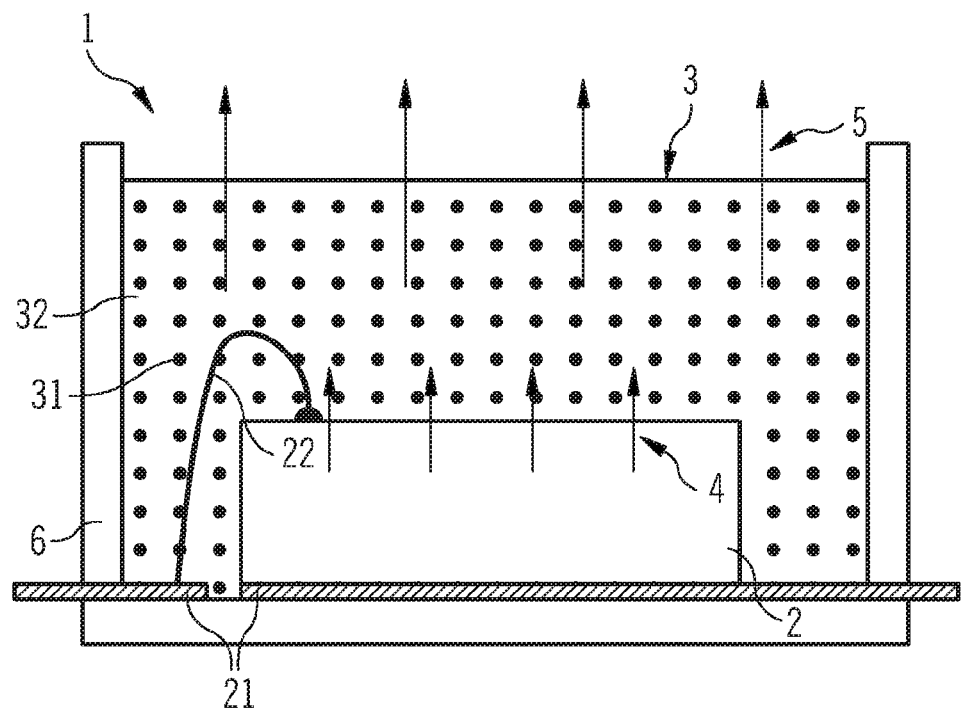
FIG. 1 shows the structure of a radiation emitting device with a radiation conversion body in cross section.

FIG. 1 shows the cross section of an embodiment of the radiation emitting device 1 according to the invention. It has a radiation emitting functional layer 2 located in a housing 6, said layer being electrically conductively contacted by two contacts 21 via a bonding wire 22. The radiation emitting functional layer 2 emits primary radiation 4. The radiation conversion body 3, which is made up of a matrix 32 and the radiation conversion luminescent material 31, is arranged around the radiation emitting functional layer 2. The radiation conversion body 3 emits the secondary radiation 5 after excitation by the primary radiation 4. Such a radiation emitting device 1 may be, for example, a luminescence conversion light emitting diode. The side walls of the housing 6 can also be inclined, and, for example, have a reflective coating that can reflect the primary radiation 4 emitted by the radiation emitting functional layer 2 and also the secondary radiation 5.

The radiation emitting functional layer 2 emits a primary radiation 4 in the UV range (preferably at wavelengths from 360 to 400 nm) or in the blue range (preferably at wavelengths from 400 to 470 nm). The material of the radiation emitting functional layer 2 comprises semiconductor materials, such as InGaN, Ga (In, Al) N or GaN. The radiation conversion luminescent material 31, which is contained in the radiation conversion body 3, can be excited in the blue and UV ranges, preferably in a range from 360 to 470 nm, and comprises a conversion luminescent material of the general formula $Ca_{3-x-y}Eu_xMe_ySiO_4Cl_2$. Its emission maximum is at wavelengths that are greater than 470 nm, preferably in the range from 470 nm to 550 nm, i.e. the radiation conversion luminescent material 31 can convert the primary radiation 4 to a longer-wavelength secondary radiation 5.

The radiation conversion luminescent material 31 has the general formula $Ca_{3-x-y}Eu_xMe_ySiO_4Cl_2$, where x is selected from the range 0.05 to 0.5. x is preferably in the range 0.1 to 0.3. If Ca is partially substituted by a metal Me (e.g. Ba, Sr or Mg, or any combination of these metals), then y is selected from the range 0 to 0.5. The emission maximum of the radiation conversion luminescent material 31 shifts depending on the degree of substitution. The radiation conversion luminescent material 31 can have the formula $Ca_{2.9}Eu_{0.1}SiO_4Cl_2$, for example. This exemplary embodiment has an emission maximum at 512 nm. In comparison to this, another radiation conversion luminescent material 31 has the formula $Ca_{2.625}Eu_{0.055}Mg_{0.32}SiO_4Cl_2$ and an emission maximum at 509 nm shifted by 3 nm relative to the luminescent material $Ca_{2.9}Eu_{0.1}SiO_4Cl_2$.

The radiation conversion body 3 can convert the primary radiation 4 either fully or only partially to secondary radiation 5. The proportion of primary radiation 4 that is converted can be controlled inter alia by varying the concentration of the radiation conversion luminescent material 31 in the matrix 32. The matrix 32 can be, for example, a silicone, glass or epoxy, into which the powdered radiation conversion luminescent material 31 is mixed depending on the requirement. The higher its concentration, the more primary radiation 4 is converted and the more the color shifts towards the secondary radiation 5. The radiation conversion body 3 can also consist of up to 100% of the radiation conversion luminescent material 31. It is advantageous if the radiation conversion luminescent material 31 is applied in a relatively thin (50 nm to 20 microns) layer on the radiation emitting functional layer 2.

Figure 2:
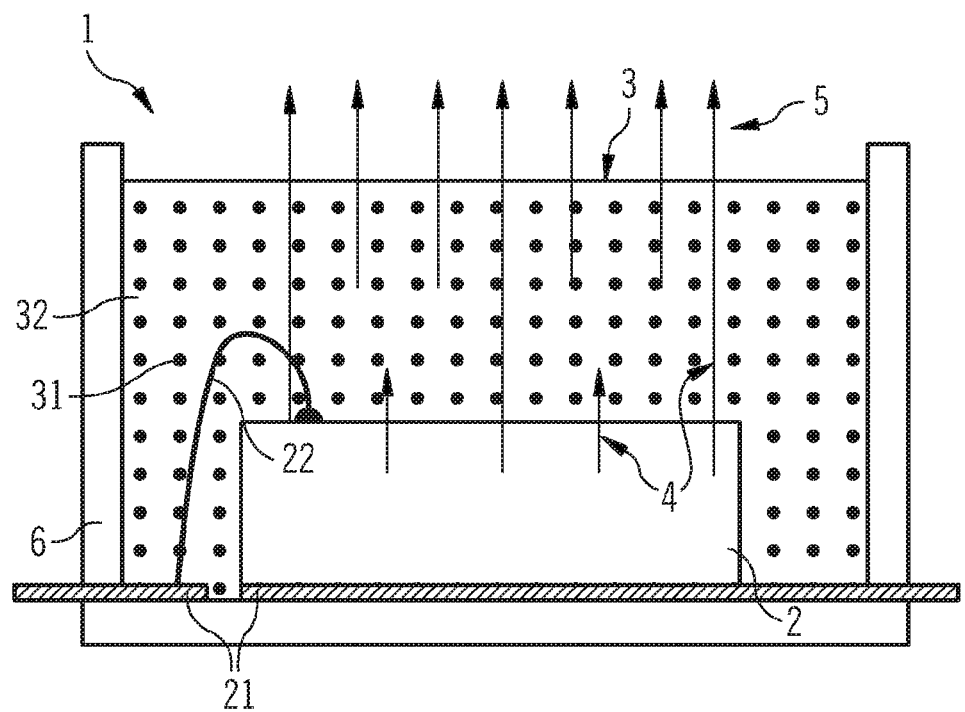
FIG. 2 shows a further embodiment of the structure of a radiation emitting device shown in FIG. 1.

One embodiment of the invention, in which the radiation conversion body 3 only partially converts the primary radiation 4 to secondary radiation 5, is depicted in FIG. 2. A cross section of an example of a radiation emitting device 1 is again shown here. The radiation of the radiation emitting device 1 is a mixture of primary radiation 4 and secondary 5 radiation. In order to produce additional colors, additional luminous materials can also be mixed into the matrix.

Figure 3:
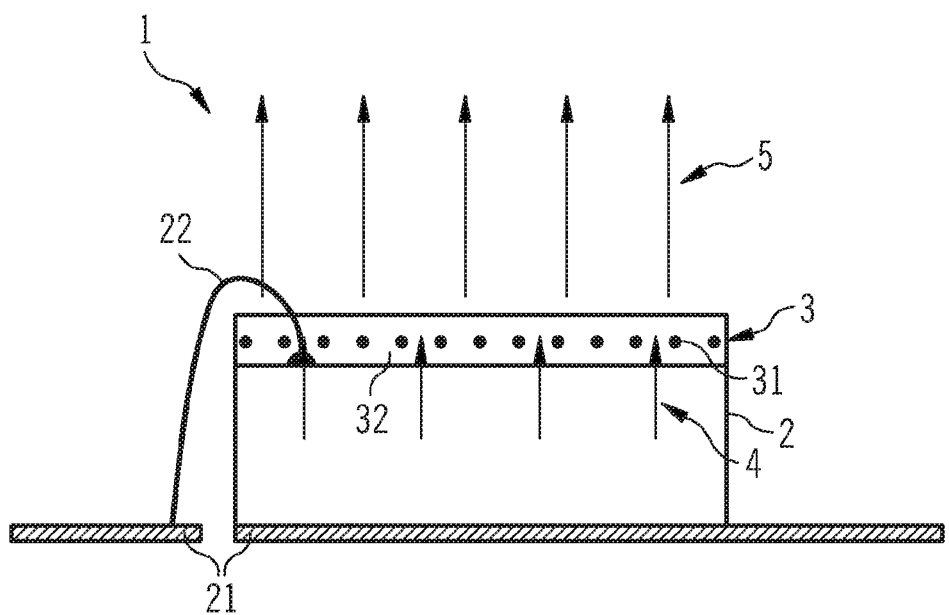
FIG. 3 shows the structure of a radiation emitting device with a radiation conversion body in cross section according to a further embodiment.

FIG. 3 shows the cross section of an embodiment of the radiation emitting device 1 according to the invention analogous to FIG. 1. In this the radiation conversion body 3, which comprises a matrix 32 and the radiation conversion luminescent material 31, is applied in the form of a relatively thin layer to the radiation emitting functional layer 2. The radiation conversion body 3 is not necessarily in contact with the radiation emitting functional layer 2 (not shown here), but there can be additional layers present between the radiation emitting functional layer 2 and the radiation conversion body 3.

Figure 4:
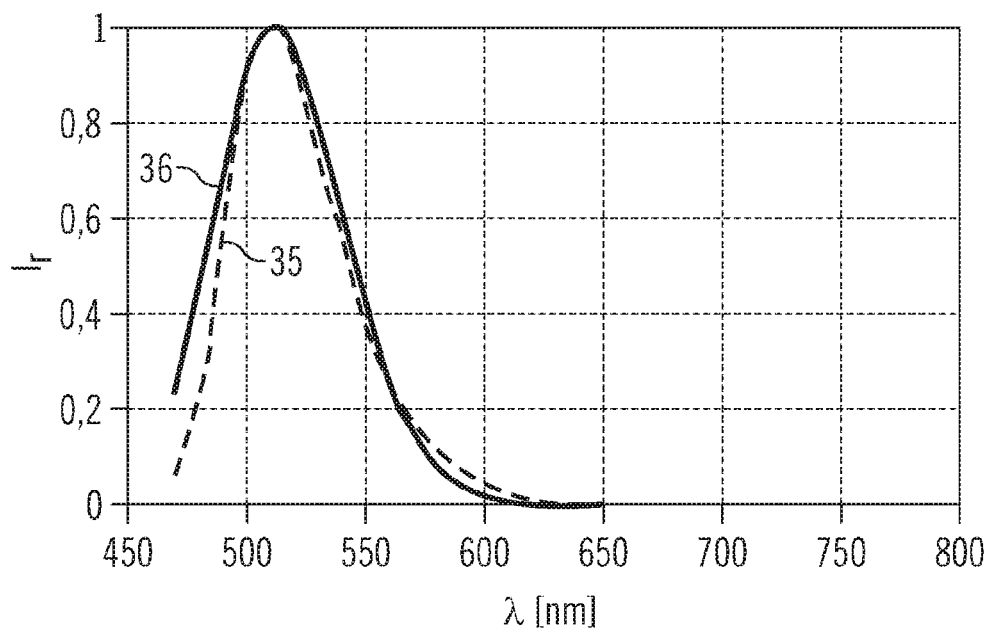
FIG. 4 shows an emission spectrum of a radiation conversion luminescent material according to an embodiment of the invention.

FIG. 4 shows an emission spectrum 36 of the radiation conversion luminescent material 31 with the formula $Ca_{2.9}Eu_{0.1}SiO_4Cl_2$. It shows the relative emission intensity $I_r$ plotted against the wavelength $\lambda$ in nm. The emission spectrum 36 of the radiation conversion luminescent material 31 according to the invention is compared with the emission spectrum 35 of another radiation conversion luminescent material with the general formula $(Ca,Eu)_8Mg(SiO_4)_4Cl_2$. The two luminescent materials differ in the locations of their emission maxima by 3 nm and a difference in the half widths of the spectra can also be seen. Both luminescent materials have very similar emission spectra and are therefore suitable for the same application areas. The advantage of the radiation conversion luminescent material 31 according to the invention consists in its simple manufacture in comparison with conventional conversion luminescent materials.

The radiation emitting device can be produced by providing a radiation emitting functional layer 2 and by positioning the radiation conversion material in the path of the radiation from the radiation emitting functional layer 2. The radiation conversion material, such as a radiation conversion body 3, e.g. a thin layer or a sealing, can be produced over the radiation emitting functional layer 2, which comprises the radiation conversion luminescent material 31. The radiation conversion luminescent material 31 can be produced by homogeneous mixing in the stoichiometric ratio of calcium carbonate, calcium chloride, europium oxide, silica and, where appropriate, strontium carbonate, barium carbonate and magnesium oxide according to the formula $Ca_{3-x-y}Eu_xMe_ySiO_4Cl_2$ with $0.05 \leq x \leq 0.5$, $0 \leq y \leq 0.5$, Me=Sr and/or Ba and/or Mg. This mixture is then annealed in a forming gas stream at 600° C. to 1000° C., preferably at 650° C. to 800° C. The compound for the radiation conversion body 3 can be produced by dispersing the radiation conversion luminescent material 31 into a matrix 32, such as silicone, glasses or epoxy.

The examples shown in FIGS. 1-4 can also be varied as desired. It should also be noted that the invention is not limited to these examples, but allows further embodiments that are not mentioned here.

The invention claimed is:

1. A radiation emitting device, comprising a radiation emitting functional layer, which emits primary radiation, and a radiation conversion material that is arranged in a path of the primary radiation from the radiation emitting functional layer and that contains a radiation conversion luminescent material of the general formula $Ca_{3-x-y}Eu_xMe_ySiO_4Cl_2$, wherein x is in the range 0.05 to 0.5 and y is in the range 0 to 0.5, wherein the radiation conversion luminescent material converts at least a portion of the primary radiation into a secondary radiation.

2. The radiation emitting device according to claim 1, wherein the radiation emitting functional layer emits primary radiation in the UV range.

3. The radiation emitting device according to claim 1, wherein the radiation emitting functional layer emits primary radiation in the blue range.

4. The radiation emitting device according to claim 1, wherein the material of the radiation emitting functional layer comprises a semiconductor.

5. The radiation emitting device according to claim 4, wherein the material of the radiation emitting functional layer comprises a semiconductor selected from the group consisting of InGaN, Ga(In,Al)N and GaN.

6. The radiation emitting device according to claim 1, wherein the radiation conversion luminescent material is excited in the blue and/or UV range.

7. The radiation emitting device according to claim 6, wherein the radiation conversion luminescent material is excited in the range from 360 nm to 470 nm.

8. The radiation emitting device according to claim 1, wherein the radiation conversion luminescent material has an emission maximum at wavelengths between 470 nm and 550 nm.

9. The radiation emitting device according to claim 8, wherein the radiation conversion luminescent material has an emission maximum at 512±3 nm.

10. The radiation emitting device according to claim 1, wherein in the radiation conversion luminescent material of the general formula $Ca_{3-x-y}Eu_xMe_ySiO_4Cl_2$, Ca is partially substituted by metals Me, wherein the metals comprise a material selected from the group consisting of: Sr, Ba and Mg.

11. The radiation emitting device according to claim 1, wherein the radiation conversion luminescent material has the formula $Ca_{2.9}Eu_{0.1}SiO_4Cl_2$.

12. The radiation emitting device according to claim 1, wherein the radiation conversion luminescent material has the formula $Ca_{2.625}Eu_{0.055}Mg_{0.32}SiO_4Cl_2$.

13. The radiation emitting device according to claim 1, wherein the radiation conversion luminescent material is formed as a radiation conversion body and covers the radiation emitting functional layer on one or more sides.

14. The radiation emitting device according to claim 13, wherein the radiation conversion body comprises a layer.

15. The radiation emitting device according to claim 13, wherein the radiation conversion body fully converts the primary radiation into secondary radiation.

16. The radiation emitting device according to claim 13, wherein the radiation conversion body partially converts the primary radiation into secondary radiation, wherein non-converted primary radiation superimposes the secondary radiation, so that a mixture of primary and secondary radiation results.

17. The radiation emitting device according to claim 13, wherein the radiation conversion body comprises a matrix containing the radiation conversion luminescent material.

18. The radiation emitting device according to claim 17, wherein the matrix is transparent.

19. The radiation emitting device according to claim 17, wherein the matrix comprises a material selected from the group consisting of epoxides, silicones and glasses.

20. The radiation emitting device according to claim 1, wherein the radiation conversion material comprises additional luminescent materials.

21. The radiation emitting device according to claim 1, wherein the radiation emitting functional layer emits primary radiation at wavelengths from 360 to 400 nm.

22. The radiation emitting device according to claim 1, wherein the radiation emitting functional layer emits primary radiation at wavelengths from 400 to 470 nm.

23. A method of manufacturing a radiation emitting device, the method comprising:
providing a radiation emitting functional layer, which emits primary radiation;
forming a radiation conversion material with a radiation conversion luminescent material in a path of the primary radiation emitted from the radiation emitting functional layer, the radiation conversion material comprising $Ca_{3-x-y}Eu_xMe_ySiO_4Cl_2$ with $0.05 \leq x \leq 0.5$ and $0 \leq y \leq 0.5$.

24. The method according to claim 23, wherein a radiation conversion body containing the radiation conversion luminescent material is arranged on the radiation emitting functional layer.

25. The method according to claim 24, wherein a matrix is used in forming the radiation conversion body, the radiation conversion luminescent material being embedded in the matrix.

26. The method according to claim 25 wherein the matrix comprises a material selected from the group consisting of epoxides, silicones and glasses.

27. The method according to claim 25, wherein a compound for the radiation conversion body is produced by dispersing the radiation conversion luminescent material in the matrix.

28. The method according to claim 23, wherein the radiation conversion luminescent material is formed by homogeneous mixing of calcium carbonate, calcium chloride, europium oxide, silica and, if y>0, an additional component selected from strontium carbonate, barium carbonate and magnesium oxide in a stoichiometric ratio according to the formula $Ca_{3-x-y}Eu_xMe_ySiO_4Cl_2$, and Me is selected from Sr, Ba and Mg, and then annealing in a forming gas stream at 600° C. to 1000° C.

29. The method according to claim 24, wherein additional luminescent materials are introduced into the radiation conversion body.

* * * * *